SEMICONDUCTOR RECTIFIER UNIT

Filed Dec. 14, 1966

Inventors:

Richard Magner

Albrecht Geppert

BY Spencer & Kaye

Attorneys

United States Patent Office 3,476,985
Patented Nov. 4, 1969

3,476,985

SEMICONDUCTOR RECTIFIER UNIT

Richard Magner, Belecke, and Albrecht Geppert, Warstein, Germany, assignors to Licentia Patent-Verwaltungs-G.m.b.H., Frankfurt am Main, Germany Filed Dec. 14, 1966, Ser. No. 601,737
Claims priority, application Germany, Dec. 15, 1965, L 52,400
Int. Cl. H01l *11/00, 13/00*
U.S. Cl. 317—234 21 Claims

ABSTRACT OF THE DISCLOSURE

Semiconductor rectifier device having at least one semiconductor rectifier wafer disposed in an opening in a mica sheet and electrically connected to two thin copper conducting strips each disposed on an opposite side of the mica sheet, thereby giving the device a substantially planar configuration and a good heat dissipating capability.

Background of the invention

The present invention relates to semiconductor devices, and particularly to semiconductor rectifier devices occupying a small volume.

It has already been suggested to construct miniature rectifier devices by stacking individual rectifier wafers between contact wafers carrying connecting lugs, or leads, the resulting stack then being embedded in a mass of casting resin and covered with a layer of synthetic material from which the leads extend. Although such devices have proven satisfactory for many purposes, it has been found that because of the poor heat-conducting properties of the casting resin and the synthetic material, they are capable of operating at low current levels.

It has also been suggested to construct rectifier cells composed of a plurality of such devices disposed in hat-shaped metal housings for operation at higher current levels. However, such arrangements suffer from the drawback that they take up a great deal of space.

It is a primary object of the present invention to reduce these drawbacks and difficulties.

A more specific object of the present invention is to improve the heat conduction properties of rectifier devices while reducing the space occupied by such devices.

A further object of the present invention is to improve the current carrying properties of semiconductor rectifier devices without increasing their space requirements.

Still another object of the present invention is to simplify the fabrication of semiconductor rectifier devices.

Yet another object of the present invention is to provide rectifier devices having a large number of semiconductor wafers and occupying a small volume.

Summary of the invention

These and other objects according to the present invention are achieved by a semiconductor circuit device including an insulating foil having at least one wafer-receiving opening, at least one semiconductor rectifier wafer having a pn junction and disposed in the opening, the wafer being at least as thick as the sheet, and at least two metal contacting strips disposed on opposite sides of the sheet and electrically connected to the wafers. These strips are arranged with respect to the sheet in such a manner that they extend beyond the edges of the sheet without overlapping one another. The strips are intended to constitute both current conducting leads and heat conducting nad dissipating bodies.

According to a principal novel feature of the present invention, a plurality of semiconducotr rectifier wafers are provided and are all disposed in the same plane.

This arrangement of the semiconductor wafers permits all of the contacting strips to be positioned near the outer surfaces of the resulting arrangement, i.e., near the outer surface of the incapsulating mass surrounding the strips and the wafers, thereby assuring that heat can be dissipated from the strips in an efficient manner. It has been found that rectifier devices produced according to the present invention can be given extremely small dimensions and yet are capable of operating at high current levels, of the order to 2 to 3 amperes for example.

Description of the preferred embodiments

Figure 1:
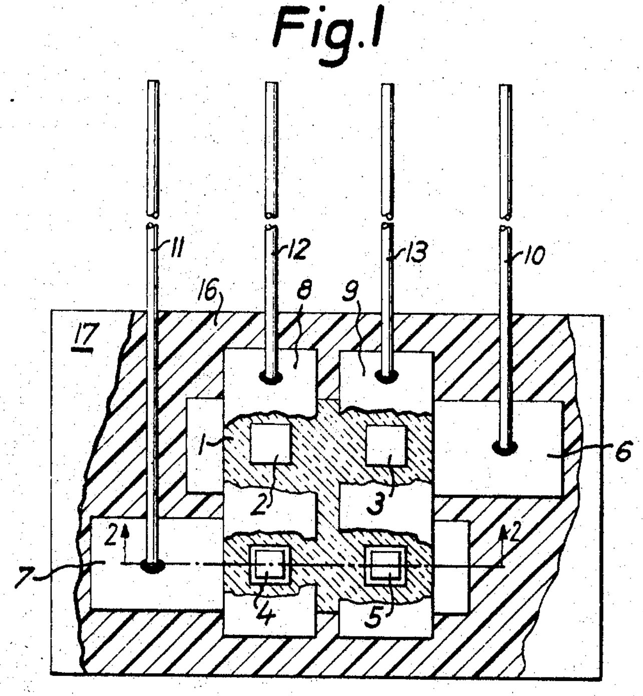
FIGURE 1 is a partially cross-sectional plan view of a preferred embodiment of the present invention.
Figure 2:
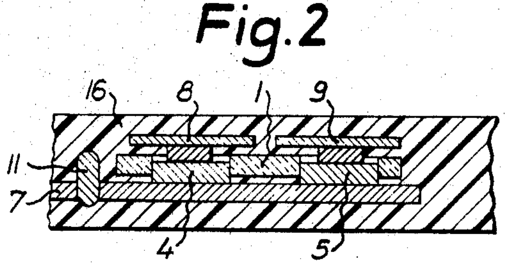
FIGURE 2 is a cross-sectional view taken along a plane defined by the line 2—2 of FIGURE 1.

Referring specifically to FIGURES 1 and 2, there is shown an insulating sheet 1, which is preferably made of mica, and which is provided with a plurality of openings into each of which is inserted a respective one of the semiconductor wafers 2, 3, 4 and 5. Each of these wafers is preferably made of silicon and is composed of two zones, preferably produced by diffusion, of opposite conductivity types and forming a pn junction between them, as is most clearly shown in FIGURE 2. Wafers 2 and 3 are oriented in a first forward conduction direction in their respective holes, while wafers 4 and 5 are oriented in the opposite forward conduction direction in their respective holes. Thus, wafers 2 and 3 could be considered to be upside down with respect to wafers 4 and 5.

The bottom surfaces of wafers 2 and 3 (as seen in the view of FIGURE 2) are disposed on, and electrically connected to, the copper foil strip 6 which has a substantial portion extending to the right of the mica sheet 1. Similarly, the bottom surfaces of wafers 4 and 5 are disposed on, and electrically connected to, a copper foil strip 7 which is disposed parallel to strip 6 and which has a substantial portion extending to the left of mica sheet 1.

Disposed upon, and electrically connected to, the upper surfaces of wafers 2 and 4 is a further copper foil strip 8 which is disposed transversely to strips 6 and 7 and which has a portion extending beyond the upper edge of mica sheet 1. Another copper foil strip 9 extends parallel to strip 8 and is disposed upon, and electrically connected to, the upper surfaces of wafers 3 and 5, strip 9 also having a portion extending beyond the upper edge of mica sheet 1.

Each of the copper foil strips is welded, or soldered, to its associated wafer surfaces and is provided with a respective one of the external leads 10, 11, 12 and 13, each of the leads preferably passing through a hole in its associated strip and being soldered to the strip.

Thus, each of the wafers defines a semiconductor rectifier having a pair of conductive electrodes constituted by a respective pair of the copper foil strips.

Rectifiers 2 and 4 are connected together in a series-aiding relationship by foil strip 8, while wafers 3 and 5 are connected together in a similar manner by strip 9. Similarly, wafers 2 and 3 are connected together in a series-opposing manner by strip 6, while wafers 4 and 5 are connected together in the same manner by foil strip 7.

The arrangement shown in FIGURES 1 and 2 may be fabricated in the following manner: the metal strips 6 and 7, each of which is provided with a lead-indium solder layer and with a hole for the insertion of a respective one of the wires 10 and 11, are placed into a soldering mold in such a way that the wires 10 and 11 can be guided past the foil strips 8 and 9 without contacting them. The mica sheet 1 is then placed upon the metal strips 6 and 7 and is also fixed within the solder molds. Then the solderable silicon wafers 2 and 5, which have been fabricated in a known manner with the aid of diffusion and etching techniques, are inserted into the holes provided in mica sheet 1, and the metal strips 8 and 9 are placed on top of the arrangement. Finally, the current lead-in wires 10, 11, 12 and 13 are placed into their respective holes. The stacked arrangement is then coated with a fluxing agent, is weighted, or otherwise suitably clamped, and is soldered at a temperature of the order of 280° C., in a protective gas atmosphere. The fluxing agent is subsequently completely removed and the arrangement is dried and embedded in a mass 16 of a cycloaliphatic epoxy resin, no additional shielding being required for the pn junctions of the wafers. The arrangement may then be provided with a covering, or coating, 17 of synthetic material.

Figure 3:
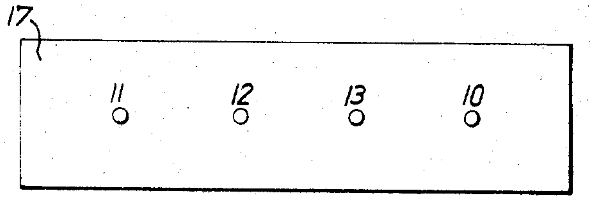
FIGURE 3 is an elevational end view of the preferred embodiment of the present invention.

FIGURE 3 shows the appearance of the resulting arrangement at the of the fabrication process.

The resulting arrangement may be employed as a rectifier bridge, a half-wave rectifier, a half-wave rectifier voltage divider, or other similar rectifier circuit.

Thus, for example, if it is desired to employ the arrangement of the present invention as a full wave rectifier bridge, it is only necessary to connect the leads 12 and 13 as the A.C. input leads and the leads 10 and 11 as the D.C. output leads. If it is desired to employ the arrangement of a half-wave rectifier, it is only necessary to connect the arrangement in series, or in parallel, in a circuit by means of leads 10 and 11, leads 12 and 13 not being connected. In order to provide a half-wave rectifier voltage divider, it is only necessary to connect the leads 10 and 11 together as input leads and the leads 12 and 13 together as output leads. It will be readily apparent that other types of circuit arrangements can also be achieved by an appropriate connection of the various leads. Moreover, any one of the rectifiers can be effectively eliminated from the circuit merely by short circuiting an appropriate pair of leads.

In embodiments of the present invention, the sheet 1 is preferably made of mica since this material will provide a satisfactory electrical insulation between the crossed metal contacting strips. The insulating sheet 1 can be readily fabricated and provided with openings in a single stamping operation.

The contacting strips 6 to 9 are preferably of copper and are preferably made as thin as possible. These strips are intended to serve as both current conducting leads and heat conducting bodies. Their heat conducting and dissipating capabilities can be enhanced by giving the portion of each strip which extends beyond sheet 1 the form of a cooling fin by providing this portion with corrugations.

It has been found that, according to one feature of the present invention, by employing copper as the material for strips 6 to 9 and by making these strips relatively thin, the stresses created in the resulting arrangement due to the differing thermal expansion coefficients of the various materials, are substantially reduced. Such stresses appear, for example, due to the fact that casting resin, in which semiconductor rectifier arrangements are usually embedded, have a coefficient of thermal expansion which differs markedly from that of conductive materials. For example, copper has a thermal expansion coefficient of the order of $160 \cdot 10^{-7}$ while the filler-free epoxy resins generally used in such assemblies have thermal expansion coefficients of the order of $600 \cdot 10^{-7}$. It is for this reason that it is generally necessary to take some special precautions to minimize the stresses to which such arrangements might be subjected. This result is accomplished in a relatively simple manner according to the present invention by using copper for these strips and by making the strips thinner than comparable prior art contacting elements.

The use of thin strips not only reduces the stresses created between the strips and the potting mass 16, but it also serves to reduce the sheer stresses inevitably created betwen the strips and the semiconductor surfaces to which they are connected, due primarily to the asymmetrical placement of the strips with respect to the semiconductor bodies, to a sufficiently small value to prevent either the semiconductor wafers or their solder connections from being subjected to breakage.

Moreover, the use of a soft metal such as copper has been found to be highly advantageous because if, by way of comparison, the contacting strips were made of a material such as iron, which is relatively rigid, the thermal expansion experienced by even thin sheets of such material would tend to produce cracks in the potting mass 16, which cracks would destroy the hermetic seal of the arrangement and thus render it useless. Soft metals such as copper do not present this difficulty.

It has been found to be preferable to give the copper strips 6 to 9 a thickness of the order of 0.2 to 0.5 millimeter. In general, the thinner the strips, the smaller will be the stresses created in the arrangement due to temperature variations. However, if the strips are made too thin their thermal resistance will become unacceptably high so that they will not be capable of satisfactorily carrying out their heat conducting function. Therefore, it is necessary to give the strips a thickness which represents a compromise between the conflicting criteria of minimum thermal stress and maximum heat conduction and it has been found that thicknesses of between 0.2 and 0.5 millimeter represent such a compromise. However, smaller thickness can be employed when the resulting arrangement is intended for use at low current levels.

It has also been found that as the thickness of such conducting strips is decreased, their tendency to bend, and hence to produce short circuits, increases. This is particularly true in arrangements of the type with which the present invention is concerned since the distance between opposing strips is determined by the thickness of the rectifier wafers, which is of the order of 0.2 millimeter. This danger is eliminated, according to a further feature of the present invention, by disposing the rectifier wafers in openings in the mica sheet 1, which opens are of substantially the same size as the wafers, and by arranging the contacting strips so that they do not overlap one another beyond the edges of the sheet 1. The provision of the mica sheet, together with the above-described arrangement of the conducting strips, assures that even if any of the strips should be bent during fabrication, it will not come into contact with any of the other strips.

The mica sheet 1 is given a thickness which is no greater than, and preferably less than, that of the wafers 2 to 5, thereby assuring that the sheet will not interfere with the formation of connections between the strips and the wafers. It has been found that mica constitutes a highly satisfactory material for the sheet 1 since it will not adversely affect the reverse voltage characteristics of the rectifier wafers.

The rectifier wafers are preferably made of silicon and their junction is preferably formed by diffusion.

In order to solder together the various elements of arrangements according to the present invention, it is desirable, primarily for reasons of efficiency, to stack the individual elements, i.e., the silicon wafers, the mica sheet, the metal contacting strips, and the external lead wires, within a suitable soldering mold, the wafers being arranged within the sheet 1, the lead wires being disposed in openings in their respective contacting strips, and the contacting strips being disposed above and below the wafers. In order to permit even extremely thin rectifier wafers to be soldered to the contacting strips, it has been found to be desirable to cover the strips with a lead-indium solder coating which is well distributed over the metal strip and which has a thickness of about 8μ (microns.) Such a thickness is adequate for obtaining good solder connections.

However, during the soldering operation it might occur that the lead-indium material coalesces at certain points and thus presents the danger of creating a short-circuit between the metal strips associated with the same semiconductor wafer. However, it has been found that the use of an extremely thin solder layer greatly minimizes this danger and that the complete separation of opposing metal strips from one another by the mica sheet entirely eliminates the danger of such short circuit occurring.

It should be appreciated that many different semiconductor rectifier arrangements, containing different numbers of rectifiers, can be fabricated according to the present invention. Moreover, such arrangements are highly advantageous because they require a minimum of space and can, for example, be employed as a portion of the power source for electrical appliances having a minimum of available space.

Since all of the rectifier wafers of arrangements according to the present invention are disposed in a single plane, all of the contacting strips will have their outer flat surfaces positioned near the outer surfaces of the potting mass enclosing the device. It therefore results that even very small devices constructed according to the invention exhibit excellent heat dissipation properties and such devices have been found to be capable of operating satisfactorily and high current levels of the order to 2 to 3 amps, for example.

It will be understood that the above description of the present invention is susceptible to various modifications, changes, and adaptations, and the same are intended to be comprehended within the meaning and range of equivalents of the appended claims.

We claim:

1. A semiconductor circuit device comprising, in combination:

(a) an insulating foil sheet having at least one wafer-receiving opening extending completely through the sheet;

(b) at least one semiconductor rectifier wafer having a pn junction and disposed in said opening, said wafer being at least as thick as said sheet; and (c) at least two metal contacting strips disposed on opposite sides of said sheet and electrically connected to said wafer, said strips extending beyond the edges of said sheet in such a manner that they do not overlap one another and constituting both current conducting leads and heat conducting bodies.

2. An arrangement as defined in claim 1 wherein said sheet is made of mica.

3. An arrangement as defined in claim 1 wherein said sheet is provided with a plurality of openings, there are provided a plurality of semiconductor rectifier wafers each disposed in a respective opening, and there are provided a plurality of metal contacting strips with each of said wafers being connected between two of said strips.

4. An arrangement as defined in claim 3 wherein said strips interconnect said wafers to form a rectifier bridge.

5. An arrangement as defined in claim 3 wherein said two strips connecting each said wafer extend at right angles to one another.

6. An arrangement as defined in claim 3 wherein said strips connecting each said wafer are disposed at respective opposite sides of, and soldered to, said wafer.

7. An arrangement as defined in claim 3 wherein at least one of said strips is connected to a plurality of said wafers.

8. An arrangement as defined in claim 7 wherein said contacting strips are disposed in a comb pattern on each side of said sheet.

9. An arrangement as defined in claim 3 wherein all of said strips on one side of said sheet are longitudinally offset with respect to one another.

10. An arrangement as defined in claim 3 wherein at least one of said wafers is disposed in its associated opening in the opposite forward conduction direction from as least another one of said wafers, and wherein all of said wafers disposed in a first forward conduction direction are connected together by one of said contacting strips disposed on one side of said sheet and all of said semiconductor wafers disposed in the opposite forward conduction direction are connected together by another one of said contacting strips disposed on said one side of said sheet.

11. An arrangement as defined in claim 10 wherein pairs of said wafers which are disposed in respectively opposite forward conducting directions are each connected together by a respective one of said contacting strips disposed on the other side of said sheet.

12. An arrangement as defined in claim 11 wherein all of said semiconductor wafers are connected in the form of a bridge by means of said contacting strips.

13. An arrangement as defined in claim 12 wherein said contacting strips which are disposed on said one side of said sheet extend beyond respectively opposite edges of said sheet and said strips disposed on said other side of said sheet extend beyond the same edge of said sheet.

14. An arrangement as defined in claim 1 further comprising a mass of casting resin enclosing said sheet, said at least one wafer, and said contacting strips.

15. An arrangement as defined in claim 14 wherein said casting resin is constituted by an epoxy resin.

16. An arrangement as defined in claim 14 further comprising a covering of synthetic material enclosing said mass of casting resin.

17. An arrangement as defined in claim 1 wherein each of said contacting strips has a free end in the form of a cooling fin.

18. An arrangement as defined in claim 17 wherein said free end of each said strip is corrugated to have an enlarged area and hence to provide an improved cooling action.

19. An arrangement as defined in claim 14 wherein said contacting strips are made of copper and each has a thickness of 0.2 to 0.5 millimeter.

20. An arrangement as defined in claim 19 in which the said strips are covered with a lead indium solder.

21. An arrangement as defined in claim 14 wherein the contacting strips are sufficiently thin to prevent stress failures in use and sufficiently thick to dissipate desired quantities of heat.

References Cited

UNITED STATES PATENTS

| | | | |
|---|---|---|---|
| 2,994,121 | 8/1961 | Shockley | 317—234 X |
| 3,133,336 | 5/1964 | Marnace | 317—235 X |
| 3,223,900 | 12/1965 | Wittwer | 317—234 |
| 3,307,077 | 2/1967 | Bernstein | 317—99 |
| 3,348,105 | 10/1967 | Doyle | 317—234 |
| 3,340,348 | 9/1967 | Clark et al. | 317—234 |

JOHN W. HUCKERT, Primary Examiner

R. F. POLISSACK, Assistant Examiner

U.S. Cl. X.R.

317—234